(12) United States Patent
Ayyapureddi et al.

(10) Patent No.: US 8,566,846 B2
(45) Date of Patent: Oct. 22, 2013

(54) SYSTEM AND METHOD FOR CONFIGURING DRIVERS

(75) Inventors: Sujeet Ayyapureddi, Boise, ID (US); Raghukiran Sreeramaneni, Boise, ID (US); Suryanarayana B. Tatapudi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1601 days.

(21) Appl. No.: 12/098,301

(22) Filed: Apr. 4, 2008

(65) Prior Publication Data

US 2009/0254925 A1 Oct. 8, 2009

(51) Int. Cl.
*G06F 9/44* (2006.01)

(52) U.S. Cl.
USPC .............................. 719/327; 326/30; 326/41

(58) Field of Classification Search
None
See application file for complete search history.

(56) References Cited

U.S. PATENT DOCUMENTS

| | | | |
|---|---|---|---|
| 6,031,385 A * | 2/2000 | Ilkbahar | 324/750.3 |
| 7,151,700 B2 | 12/2006 | Ba | |
| 2007/0200591 A1 * | 8/2007 | Kim | 326/30 |

OTHER PUBLICATIONS

U.S. Appl. No. 11/856,352, filed Sep. 17, 2007.
U.S. Appl. No. 11/432,421, filed May 10, 2006.
Churoo (Chul-Woo) Park, et al.; A 512-Mb DDR3 SDRAM Protoype with C10 Minimization and Self-Calibration Techniques; IEEE Journal of Solid State Circuits, vol. 41, Apr. 2006.
DDR3 SDRAM Specification, JESD79-3A; (Revision of JESD79-3); JEDEC Solid State Technology Association; Sep. 2007; www.jedec.org/Catalog/catalog.cfm.

* cited by examiner

*Primary Examiner* — Crystal L Hammond
(74) *Attorney, Agent, or Firm* — Fletcher Yoder (57) ABSTRACT

Driver systems and methods are provided, such as those that include identifying a process corner of a driver; and configuring the driver based on the identified process corner. Further embodiments provide a method that includes detecting a process corner of a driver, setting a reference voltage of a calibration circuit based on the process corner detected, and configuring the driver based on the reference voltage.

14 Claims, 5 Drawing Sheets

SYSTEM AND METHOD FOR CONFIGURING DRIVERS

BACKGROUND

1. Field of the Invention

Embodiments of the invention relate generally to the field of memory sub-systems and more particularly, to techniques for maintaining and/or lowering the pin-capacitance of a driver across corners.

2. Description of the Related Art

Digital processing and communication systems have continued to rapidly increase in speed. This increase in speed has brought with it increasingly tighter constraints that are imposed upon integrated circuits (ICs) used in such systems. Whether a given IC meets such constraints is controlled in significant part by how well the IC's processing parameters conform to target values. Threshold voltages, doping concentrations, and resistance values of the various layers that makeup a modern IC, just to name a few examples, can all affect whether an IC conforms to a given set of constraints. These parameters may affect the operational speed of individual devices within an IC.

One way that the speed or performance of the devices within an IC can be described is by way of what are known as "process corners." These corners describe the speed of a device or combination of devices measured at different operating condition extremes (e.g., corners). Several operating parameters can be used to define a corner, such as, for example, temperature and voltage (e.g., process, voltage, and temperature (PVT) corners). Thus, for example, a resistive device and a capacitive device coupled in series can be used as a reference circuit within an IC, wherein the pre-charge and discharge rates of the circuit are measured under differing temperature and voltage conditions. The measured performance, when compared to the expected (e.g., targeted) performance, provides a measure of how close one or more of the processing parameters of the IC are to their target values in the final operational IC.

In the case of complimentary metal-oxide semiconductor (CMOS) ICs, process corners are described in terms of the speed of metal-oxide semiconductor (MOS) devices with positively doped channels (PMOS devices), and MOS devices with negatively doped channels (NMOS devices), as well as in terms of the device structures used to measure the performance of a device. Thus, for example, two resistive devices and capacitive device pairs (the components of each pair coupled in series, one pair including PMOS devices and the other pair including NMOS devices) may be used to characterize a high temperature/low voltage process corner identified as an HL_RC corner. If the PMOS side is faster than the targeted speed at the given temperature and voltage, and the NMOS side is slower than targeted, the corner is referred to as an FS corner, meaning fast (relative to a target (e.g., typical) speed) for the PMOS side, and slow (again relative to typical) for the NMOS side. The actual measured performance at a process corner can be used to determine if a device is within tolerance and will conform to a particular set of constraints.

As already noted, increases in the operational speed have continued to narrow constraints imposed upon ICs. But as the allowable deviations of the measured performance of devices at the various process corners decreases, the production yield of such ICs also tends to decrease, as it becomes increasingly difficult to control the process parameters to the resolution necessary to conform to target process corners. One solution that has been developed has been to design into ICs the ability to adjust the configuration of operational devices to compensate for variations in process corners that result from variations in processing parameters.

An example of a circuit that compensates for variations in process corners is the ZQ calibration circuit used within double data rate, version 3 (DDR3) synchronous dynamic random access memories (SDRAMs). Such a circuit adjusts the characteristic impedance of a driver (e.g., an output driver) by compensating for changes in process corners associated with both active MOS devices as well as internal resistive devices. However, other considerations typically remain, such as, the impedance (Ron) and the linearity of the driver circuit. More specifically, the driver may not meet both the DQ pin-cap and the impedance across all or most of the process corners and across all of the output voltages of the driver circuit. Designing a driver to meet the impedance specification at a majority and/or all of PVT corners, including the slow-slow (SS) corner, generally ensures that driver has better impedance (e.g., linearity) at all of process corners, but may still be susceptible to raising the DQ pin-cap. Further, statistically, some corners, such as the SS corner, is present in only a small percentage of the overall circuits that are produced, and to impart one solution for all of the circuits would likely penalize the circuits exhibiting the more common process corners (e.g., the FS, typical-typical (TT), fast-fast (FF) corners) by raising the DQ pin-cap in an attempt to account for only a small percentage of devices that exhibit the SS corner.

DETAILED DESCRIPTION OF SPECIFIC EMBODIMENTS

As discussed in further detail below, systems and methods are disclosed that relate to techniques for maintaining a low pin-capacitance of a driver across process, voltage, and temperature (PVT) corners. More specifically, certain embodiments include configuring a driver to provide the desired output impedance/resistance linearity while maintaining a relatively low output pin capacitance. In some embodiments, a method is employed that identifies one or more corners of the driver, and selects a configuration of the driver that accounts for the corners identified. In certain embodiments, this is accomplished by identifying a process corner and dynamically adjusting (e.g., trimming) a reference voltage input to a calibration circuit, thereby, forcing the calibration circuit to configure the driver accordingly. Before a detailed discussion of the system and methods described in accordance with various embodiments of the present invention, it may be beneficial to discuss embodiments of memory devices that may incorporate the devices described herein, in accordance with embodiments of the present technique.

Figure 1:
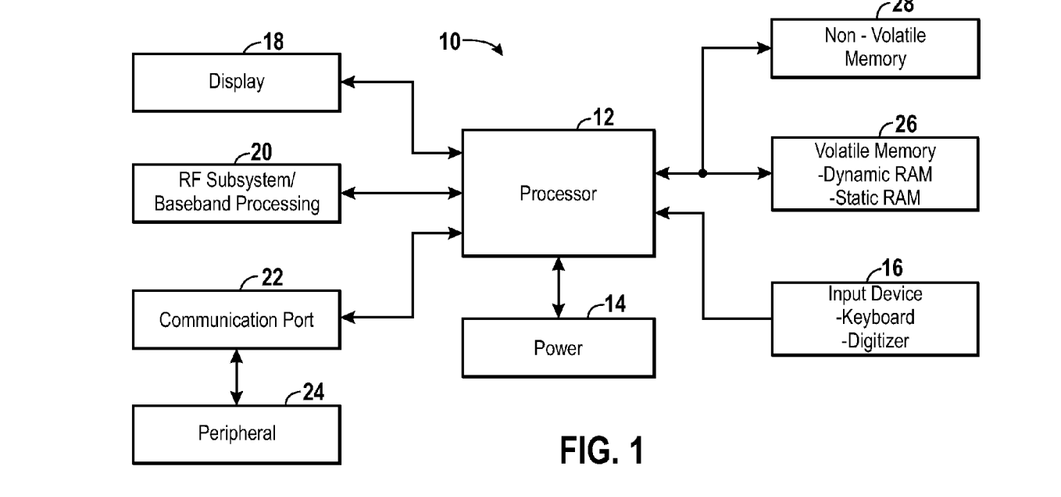
FIG. 1 is a block diagram that illustrates a processor-based system in accordance with one or more embodiments of the present invention.

Turning now to the figures, FIG. 1 is a block diagram that depicts a processor-based system, generally designated by reference numeral 10. The system 10 may be any of a variety of types such as a computer, pager, cellular phone, personal organizer, control circuit, etc. In a typical processor-based system, one or more processors 12, such as a microprocessor, control the processing of system functions and requests in the system 10.

The system 10 typically includes a number of components. For example, the system 10 includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The memory is operably coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 is typically large so that it can store dynamically loaded applications and data. As described further below, the volatile memory 26 may be configured in accordance with embodiments of the present invention.

The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. Additionally, the non-volatile memory 28 may include a high capacity memory such as a tape or disk drive memory.

Figure 2:
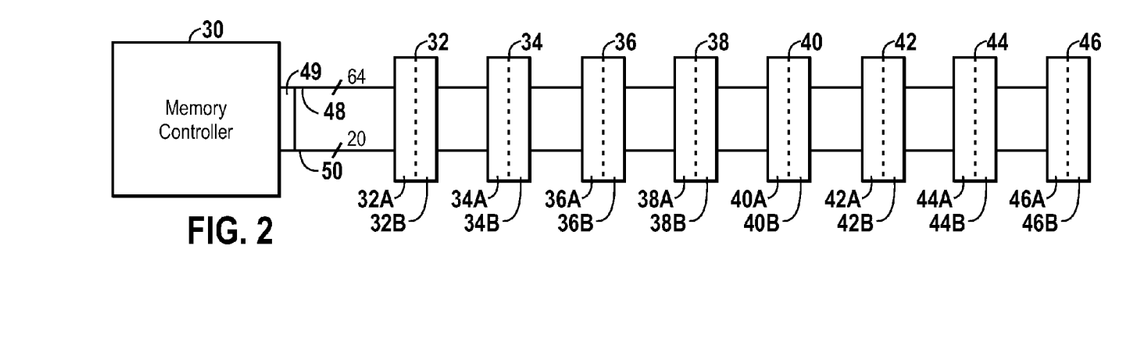
FIG. 2 is a block diagram that illustrates a memory sub-system in accordance with one or more embodiments of the present invention.

FIG. 2 generally illustrates a block diagram of a portion of a memory sub-system, such as the volatile memory 26. A memory controller 30 is generally provided to facilitate access to memory devices in the volatile memory. The memory controller 30 may receive requests to access the memory devices via one or more processors, such as the processor 12, via peripheral devices, such as the peripheral device 24, and/or via other systems. The memory controller 30 is generally tasked with facilitating the execution of the requests to the memory devices and coordinating the exchange of information, including configuration information, to and from the memory devices.

The memory sub-system may include a plurality of slots 32-46. Each slot 32-46 is configured to operably couple a memory module, such as a dual-inline memory module (DIMM), to the memory controller 30 via one or more memory buses. Each DIMM generally includes a plurality of memory devices such as dynamic random access memory (DRAM) devices capable of storing data, as described further below with reference to FIG. 3. Each DIMM has a number of memory devices on each side of the module. Each side of the module may be referred to as a "rank." Accordingly, each slot 32-46 is configured to receive a single DIMM having two ranks. For instance, the slot 32 is configured to receive a DIMM having ranks 32A and 32B, the slot 34 is configured to receive a DIMM having ranks 34A and 34B, and so forth. In the present embodiment, each of the eight memory slots 32-46 is capable of supporting a module comprising eight individual memory devices on each rank 32A/B-46 A/B, as best illustrated with respect to FIG. 3, described further below.

Referring again to FIG. 2, the memory buses may include a memory data bus 48 to facilitate the exchange of data between each memory device on the DIMMs and the memory controller 30. The memory data bus 48 comprises a plurality of single bit data buses each coupled from the memory controller 30 to a memory device. As will be described further below with respect to FIG. 4, the data bus 48 may also include one or more drivers (e.g., output drivers) 49 that modify signals routed through a memory module, such as data signals traveling across the data bus 48, such they can be transmitted to and/or interpreted by an output coupled to the memory data bus 48 and/or the memory module. For example, the output driver can be configured to regulate the impedance of signals transmitted on the data bus, as is discussed in further detail below with regard to FIG. 4. As will be described further below with respect to FIG. 4, the data bus 48 may also include one or more drivers that can adapt and/or modify signals routed through a memory module, such as data signals traveling across the data bus 48, such they can be transmitted to and/or interpreted by an output coupled to the memory data bus 48 and/or the memory module. In one embodiment of the volatile memory 26, the memory data bus 48 may include 64 or more individual data buses. Further, the memory data bus 48 may include one or more individual buses to each memory rank 32A/B-48A/B which may be used for ECC error detection and correction. As can be appreciated by those skilled in the art, the individual buses of the memory data bus 48 will vary depending on the configuration and capabilities of the system 10.

The volatile memory 26 also includes a command bus 50 on which address information such as command address (CA), row address select (RAS#), column address select (CAS#), write enable (WE#), bank address (BA), chip select (CS#), clock enable (CKE), and on-die termination (ODT), for example, may be delivered for a corresponding request. Further, the command bus 50 may also be used to facilitate the exchange of configuration information at boot-up. As with the memory data bus 48, the command bus 50 may comprise a plurality of individual command buses. In the present embodiment, the command bus 50 may include 20 individual buses. As previously described with reference to the memory data bus 48, a variety of embodiments may be implemented for the command bus 50 depending on the system configuration.

Figure 3:
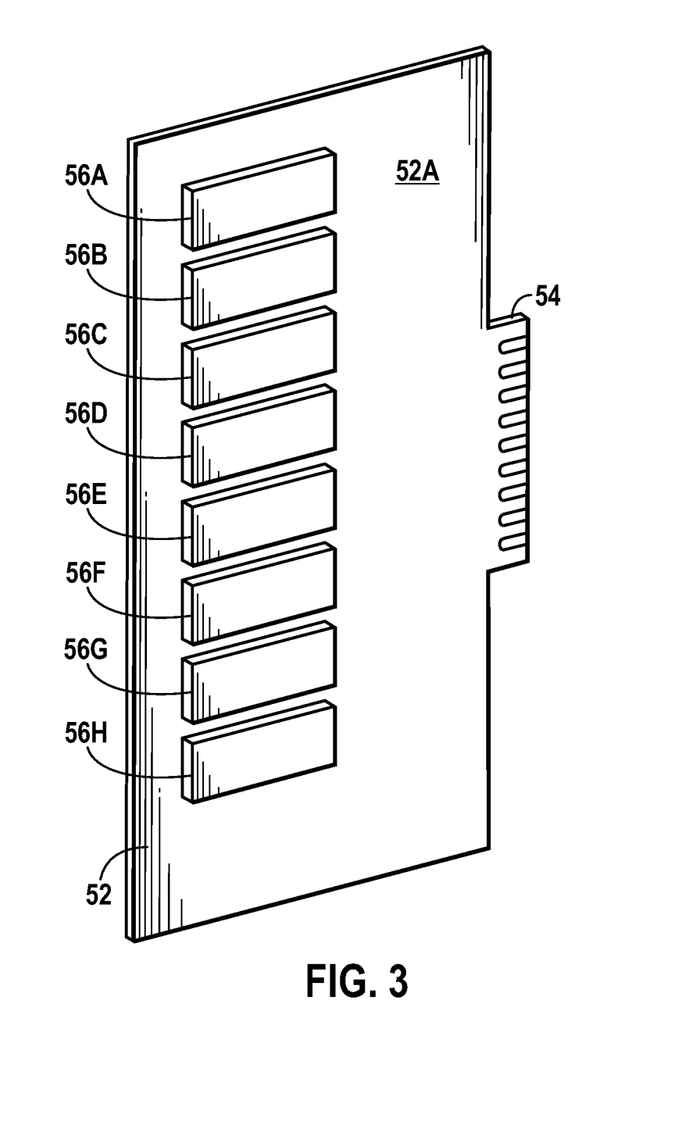
FIG. 3 is a block diagram that illustrates a memory module in accordance with one or more embodiments of the present invention.

FIG. 3 illustrates a memory module 52, such as a DIMM, that may be inserted into one of the memory slots 32-46 (FIG. 2). In the present view, one side of the memory module 52 is illustrated, and generally designated as the rank 52A. As previously discussed, the memory module 52 may include two ranks 52A and 52B. The rank 52A includes a plurality of memory devices 56A-56H, such as synchronized dynamic random access (SDRAMs), which may be used for storing information. As will be appreciated, the second opposing side of the memory module 52 (52B, not shown) also includes a number of memory devices. The memory module 52 may include an edge connector 54 to facilitate mechanical coupling of the memory module 52 into one of the memory slots 32-46. Further, the edge connector 54 provides a mechanism for electrical coupling to facilitate the exchange of data and control signals from the memory controller 30 to the memory devices 56A-56H (and the memory devices on the second rank) on the memory module 52.

Figure 4:
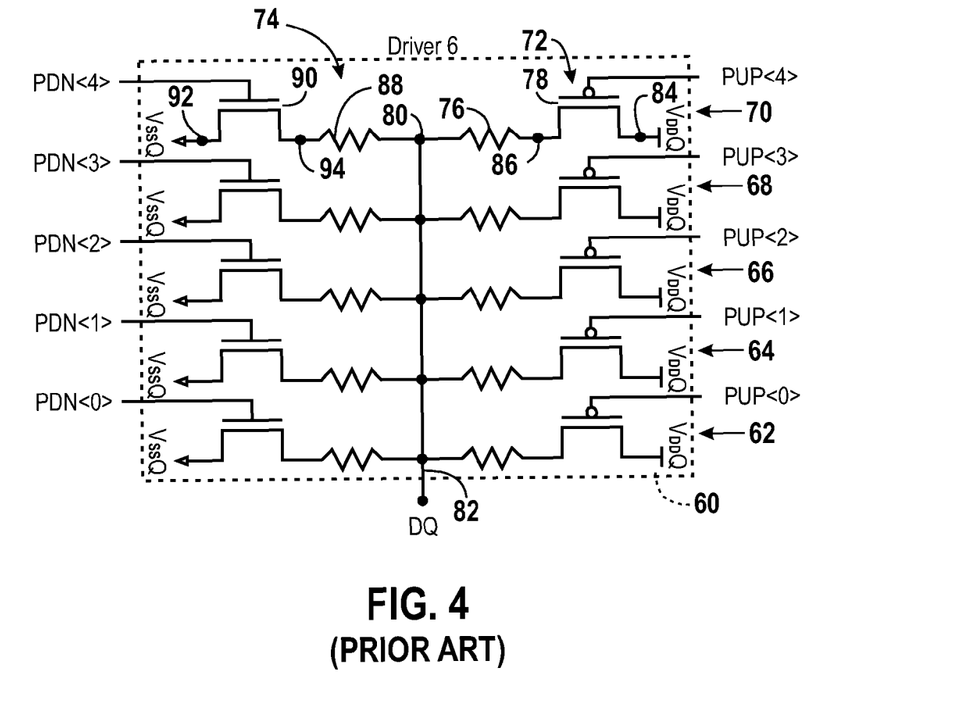
FIG. 4 is schematic diagram that illustrates a driver in accordance with certain techniques.

FIG. 4 is a schematic diagram of an driver (e.g., output driver) 60 in accordance with certain techniques. The driver 60 includes five driver circuits 62, 64, 66, 68 and 70 that each includes a pull-up leg 72 and a pull-down leg 74. The pull-up leg 72 includes a fixed (e.g., passive) resistor 76 coupled in series with a variable transistor 78. The fixed resistor 76 is coupled between the variable transistor 78 and a node 80 of the data line 82 that terminates at a data node (e.g., the DQ node) such as a DQ pin. In one embodiment, the fixed resistor 76 includes a polyresistor and the variable transistor 78 includes a PMOS device. A first node 84 of the transistor 78 is coupled to a first power supply line (VddQ), and a second node 86 is coupled to the fixed resistor 82. Pull-up signals (PUP<4:0>) are input to each gate of the five transistors 78 of the five driver circuits 62-70, respectively. Although not depicted in FIG. 4, each of the pull-up signals (PUP<4:0>) may be routed through additional circuitry, such as a calibration circuit, a pre-pre-driver stage and/or a pre-driver stage that provide appropriate conditioning and/or calibration of the pull-up signals (PUP<4:0>) input to the variable transistors 78.

Similar to the pull-up leg 72, the pull-down leg 74 includes a fixed (e.g., passive) resistor 88 coupled in series with a variable transistor 90. The fixed resistor 88 is coupled between the variable transistor 90 and the node 80 of the data line 82. In one embodiment, the fixed resistor 88 includes a polyresistor and the variable transistor 90 includes an NMOS device. A first node 92 of the transistor 90 is coupled to a second power supply line (VssQ) and a second node 94 is coupled to the fixed resistor 88. Pull-down signals (PDN<4:0>) are input to each gate of the five transistors 90 of the five driver circuits 62-70, respectively. Similar to the pull-up leg 72, although not depicted in FIG. 4, each of the pull-down signals (PDN<4:0>) may be routed through additional circuitry, such as a calibration circuit, a pre-pre-driver stage and/or a pre-driver stage that provide appropriate conditioning and/or calibration of the pull-down signals (PDN<4:0>) input to the variable transistors 90.

In operation, the driver 60 exhibits a driver resistance that is attributable to the combined resistances of the pull-up legs 72 and the pull-down legs 74 of the driver circuits 62-70. Thus, the driver resistance can be configured by varying the states of the pull-up (PUP<4:0>) and the pull-down signals (PDN<4:0>). For example, in one embodiment, each of the pull-up signals (PUP<4:0>) and/or each of the pull-down signals (PDN<4:0>) are enabled or disabled to configure the driver 60 to a configuration (e.g., a state) that correspond to different resistances. It is noted that, in some embodiments, one of the driver circuits 62-70 of the driver 60 remains enabled and the other driver circuits are enabled or disabled to achieve the desired resistance. For example, in one embodiment, PUP<4> and PDN<4> are always enabled, thereby, enabling the variable transistors 78 and 90 of the driver circuit 70. The other driver circuits 62-68 are enabled or disabled by the corresponding pull-up and pull-down signals (PUP<3:0> and PDN<3:0>) to achieve the desired resistance.

Typically, the configuration of the driver 60 and, thus, the driver resistance, is configured by a calibration circuit that measures the resistance of the driver 60, compares the resistance to one or more baseline values, and configures the driver 60 based on the comparison. For example, a calibration circuit in a DDR3 memory system generally compares the pull-up or pull-down side of the driver 60 to an external resistor to determine whether or not the driver 60 has a desired resistance. Based on the comparison, the calibration circuit makes adjustments to the driver 60, such as enabling and/or disabling the pull-up legs 72 and/or the pull-down legs 74, until a configuration is found that provides the desired resistance.

Figure 5:
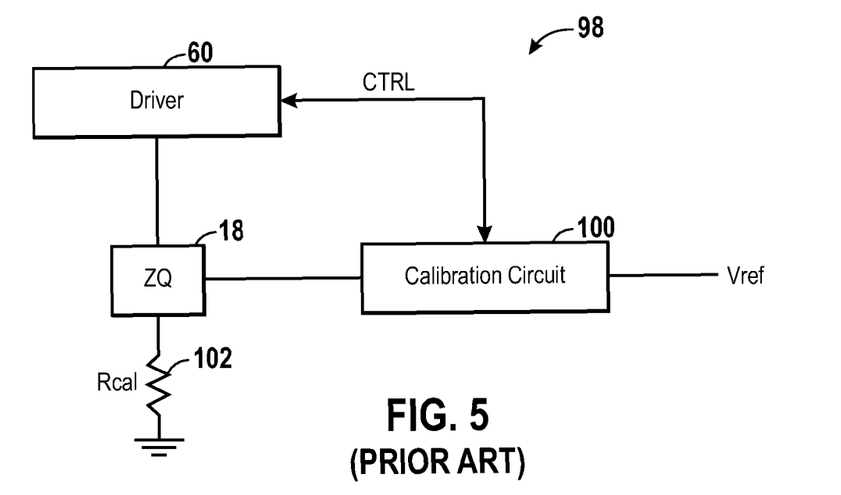
FIG. 5 is a block diagram that illustrates a calibration system in accordance with certain techniques.

FIG. 5 is a block diagram that illustrates a driver system 98 including a calibration circuit 100 coupled to the driver 60, in accordance with certain techniques. In the illustrated embodiment, the calibration circuit 100 includes an input coupled to a node (e.g., a ZQ node), such as a ZQ pad, a reference voltage (Vref) input, and control signals (CTRL) passing to and from the driver 60.

The ZQ node is located between an output of the driver 60 and a calibration resistor 102 coupled to ground. Accordingly, the ZQ pad is coupled to a mid-point of what is essentially a voltage divider created by the driver 60 and the calibration resistor 102. Thus, the ZQ pad includes an output similar to the data pin DQ when both sides of the driver 60 are calibrated and operating. Further, during operation, the output voltage (VdQ) of the driver 60 is present at the ZQ pad.

The calibration circuit 100 typically configures (e.g., calibrates) one side of the driver 60 at a time. For example, during calibration, only the pull up side is compared to the calibration resistor 102, followed by comparison of the calibration resistor 102 to the pull-down side of the driver 60. However, in some embodiments, the pull-down side is calibrated against the pull-up side, as opposed to the external resistor 102.

In a typical DDR3 system, the calibration resistor 102 has a fixed resistance of approximately 240 ohm. Accordingly, the external resistor 102 enables the calibration circuit 100 to configure the driver 60 in a configuration having an equivalent resistance of 240 ohms. Further, the reference voltage (Vref) is typically equal to about one-half of a supply voltage (VddQ) of the driver 60. This may be attributable to the reference voltage (Vref) typically employed for comparison of a voltage at the midpoint (ZQ pad) of a voltage divider coupled to the calibration circuit. For example, in an embodiment where VddQ is supplied to the driver 60, the reference voltage (Vref) is approximately one-half of VddQ. In an embodiment, such as in DDR3 systems, where VddQ is about 1.5 V, the reference voltage (Vref) is typically about 0.75 V. The control signals (CTRL) generally include the pull-up signals (PUP<4:0>) and pull-down signals (PDN<4:0>) that are used to configuring the driver 60 in one or more states that correspond to different resistances. For example, in one embodiment, the calibration circuit 100, regulates each pull-up signal (PUP<4:0>) and/or each pull-down signal (PDN<4:0>) to configure the driver 60 to sixteen different states.

In operation, the calibration circuit 100 compares the voltage at the ZQ node to the reference voltage (Vref) to determine whether or not the resistance of the driver 60 is the same as the resistance of the calibration resistor 102. For example, in one embodiment, the calibration circuit 100 cycles the driver 60 through a plurality of (e.g., sixteen) configurations via the control signals (CTRL), while comparing the voltage at the ZQ node to the reference voltage (Vref). After cycling though the plurality of configurations, the calibration circuit 100 configures the control signals (CTRL) and, thus, configures the driver 60 to the configuration that produced a voltage (output voltage VdQ) at the ZQ node closest to the reference voltage (Vref). Accordingly, the calibration circuit 100 configures the pull-up side of the driver 60 to a resistance value closest to the resistance value of the calibration resistor 102. A similar routine is typically employed to calibrate the pull-down side. However, as mentioned previously, in some embodiments, the pull-down side is calibrated against the pull-up side, as opposed to the external resistor 102. It will be appreciated that the discussion focuses on impedance and resistance, however, the two terms may be used interchangeably due to assumptions that there is no inductance and/or capacitance. Accordingly the term "impedance/resistance" is often used herein to reflect this relative interchangeability.

The previously discussed driver 60 and associated techniques are generally deterministic and produce an optimum capacitance value at the data pin (DQ), often referred to as the DQ pin-capacitance (DQ pin-cap). However, other design considerations remain, including, the output impedance (Ron) and the linearity of the driver 60 at other output voltage values. More specifically, because the calibration circuit 100 configures the driver based on one voltage value (Vref) the driver 60 may exhibit a suitable resistance (impedance) at the output voltage corresponding to the reference voltage level (e.g., VddQ/2), but this may or may not hold true for other output voltage values. For example, where a driver has certain process corners (e.g., slow (SS) transistor corner), the linearity (e.g., the slope) of the resistance (impedance) values versus the output voltage (VdQ) may vary. Where there is less linearity, there is potential that the resistance (impedance) of the driver 60 will fall out of specification at certain output voltage values. Accordingly, it is desirable that the DQ pin-cap remains low and the linearity remains high. Unfortunately, there is usually a trade off between the DQ pin-cap and linearity. More specifically, the DQ pin-cap tends to increase with an increase in linearity, and, thus improved linearity leads to an undesirable increase in the DQ pin-cap. For example, good linearity can be obtained with larger drivers, but larger drivers tend to increase the DQ pin-cap which is generally undesirable. Compounding this concern is the large variation in process (e.g., the physical variations between components of the drive circuit). For example, the driver typically exhibits the worst linearity at a slow (SS) transistor corner, while the driver exhibits better linearity at the other process corners.

It will be appreciated that linearity can be defined by slope of the resistance (or impedance) versus the output voltage (VdQ). More specifically, in certain circumstances, the linearity is defined by the slope of the resistance (or impedance) at output voltages of 0.3 V and 1.2 V. For example, the linearity (slope) may be expressed as:

$$L = \frac{ZdQ_{1.2V} - ZdQ_{0.3V}}{ZdQ_{0.3V}} * 100 \quad [1]$$

where L is linearity (slope), $ZdQ_{1.2V}$ is the impedance/resistance at 1.2 volts, and $ZdQ_{0.3V}$ is the impedance/resistance at 0.3 volts.

Figure 6:
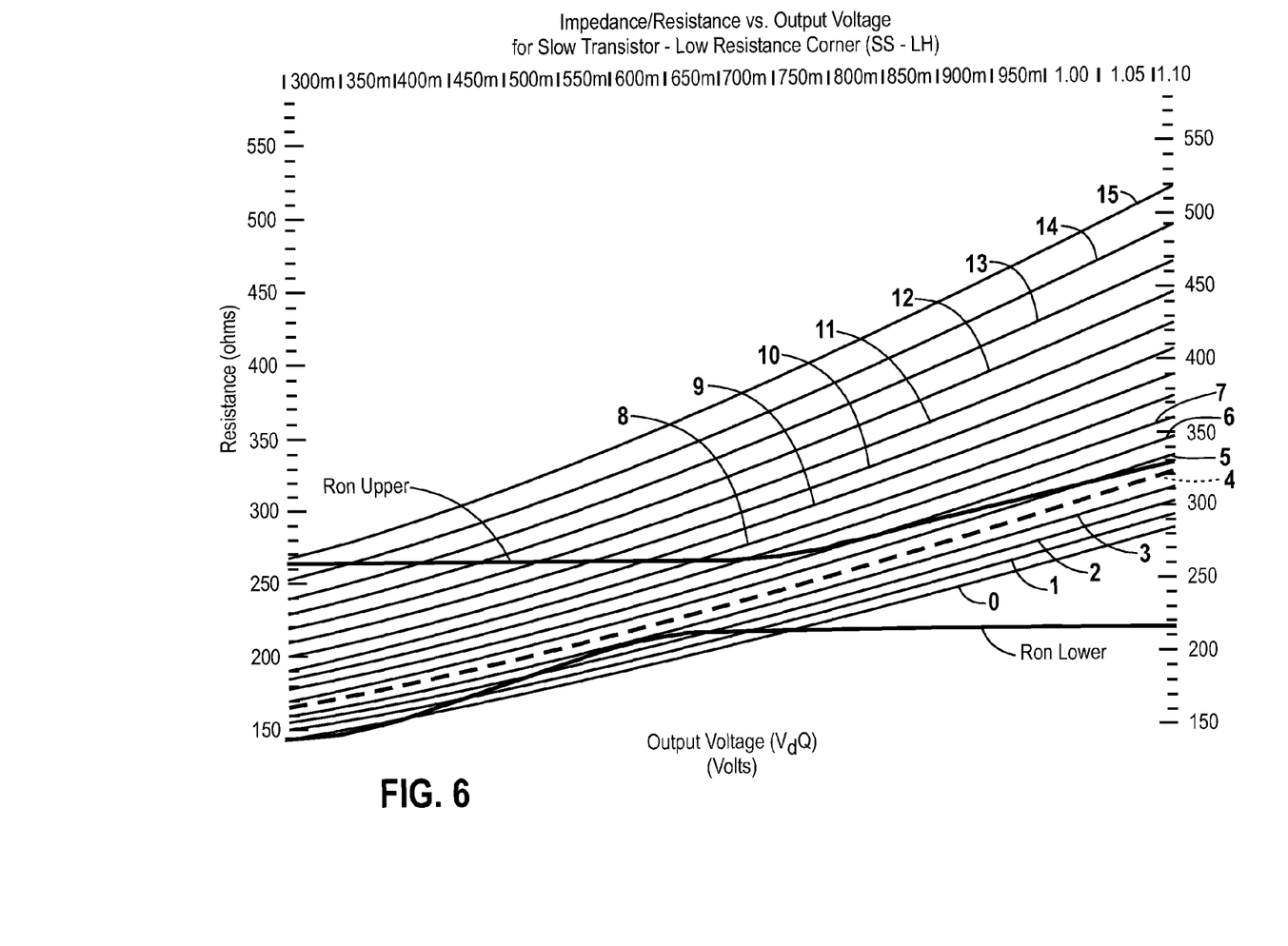
FIG. 6 is a plot of impedance curves in accordance with one or more embodiments of the present invention.

FIG. 6 is a plot that depicts impedance/resistance curves for a driver 60. More specifically, the plot illustrates the impedance/resistance curves (0-15) for the pull-down side of a driver 60 including a slow transistor—low resistance corner (SS_LH). The X-axis represents the output voltage (VdQ) measured at the data pin DQ, and the Y-axis represents the corresponding impedance/resistance in ohms. The sixteen curves (0-15) correlate to the sixteen possible configurations of the pull-down side of the driver 60, respectively. In addition to the sixteen curves (0-15), the plot also includes two lines (Ron Upper and Ron Lower) that are representative, respectively, of the upper and lower limits of impedance/resistance. These lines (Ron Upper and Ron Lower) are typically defined by industry standards, such as those provided by JEDEC. As illustrated, the lines (Ron Upper and Ron Lower) provide a visual indication of the limits on linearity (e.g., slope) across the range of the output voltages (VdQ).

In accordance with the calibration techniques discussed previously, the plot of FIG. 6 may be helpful in further explaining techniques employed by the calibration circuit 100. For example, during a conventional calibration routine, the calibration circuit 100 typically calibrates the resistance of the driver 60 based on a single reference voltage level (Vref). Thus, the calibration circuit 100 essentially looks at one vertical slice of this plot. For example, during calibration, the reference voltage (Vref) is VddQ/2 which corresponds to an output voltage (VdQ). Where VddQ is about 1.5 V, the reference voltage (Vref) is about 0.75 V. Accordingly, the calibration circuit 100 generally selects the configuration, such as that represented by curve (5), that is closest to the target resistance of 240 ohms at an output voltage (VdQ) that is equal to about 0.75 V. In other words, the calibration is accomplished by comparing one output voltage value to one reference voltage, and it is assumed that the selected solution is acceptable across the other output voltages of the driver 60.

Unfortunately, as can be seen in the plot, the curves have varying linearity (slope) that may cause them to fall out of the impedance (Ron) specification limits (e.g., the range defined by Ron Upper and Ron Lower) at certain output voltage values. This is illustrated by the curves intersecting and/or crossing the impedance specification lines (Ron Upper and Ron Lower) in the plot. For instance, although the curve (5) that was selected as a configuration that is well between the impedance specification lines (Ron Upper and Ron Lower) at the calibration DQ voltage of 0.75 V, the curve (5) intersects and crosses the upper impedance specification line (Ron Upper) at higher voltage values (e.g., 1.05 V). This indicates that where the output voltage is above approximately 1.05 V, the driver 60 may be out of the impedance specification (Ron). It is again noted that this is a plot of a worst case corner, such as a slow transistor—low resistance corner (SS_LH) that exhibits reduced linearity. In a device that exhibits better PVT corners, the linearity may be greater and the configuration selected by the calibration circuit 100 may fall within the impedance specification lines (Ron Upper and Ron Lower) across all of the output voltages of the driver 60.

It is noted that one of the curves (4) falls within the impedance specification limit (Ron Upper and Ron Lower) across the entire observed range of the output voltage (VdQ). Accordingly, although the curve (4) represents a configuration of the driver 60 that has a lower resistance (e.g., below 240 ohms), the configuration falls within the impedance specification limit (Ron Upper and Ron Lower) across the observed range of the output voltage (VdQ). Thus, according to one or more embodiments of the present invention, the driver configuration that yielded the impedance curve (4) could be selected (whereas a conventional calibration routine would have selected curve (5), as discussed above). It is noted that in this plot, only one curve (4) fell within the impedance specification (Ron Upper and Ron Lower) across the observed range of the output voltage (VdQ). However, if another curve fell within the impedance specification across the observed range of the output voltage (VdQ), the corresponding configuration may be selected instead.

Accordingly, one embodiment includes identifying a PVT corner of the driver 60, and configuring the driver 60 based on the PVT corner. For example, in one embodiment, the driver 60 is configured to have a resistance that is different from the resistance (e.g., 240 ohms) of the calibration resistor 102 to account for variations in linearity (slope) of a PVT corner. Further, it is noted that this configuration may be employed in certain conditions, whereas the configuration may not be employed in others. For example, because statistics show that a majority of drivers 60 do not exhibit worst case PVT corners, the majority of drivers 60 may be configured to one configuration (e.g., the configuration corresponding to a 240 ohm resistance), whereas drivers 60 that exhibit the other PVT corners (e.g., the slow transistor—low resistance corner (SS_LH)) may be configured to another configuration (e.g., the configuration corresponding to a resistance lower than 240 ohms, such as 225 ohms, or the like).

Configuring (e.g., calibrating) the driver 60 may include varying the reference voltage (Vref) input to the calibration circuit 100 to force the calibration circuit 100 to select a configuration of the driver 60 that is different from a configuration that the conventional calibration circuit 100 would otherwise select. In other words, when a PVT corner is identified that is not expected to meet the impedance specifications (e.g., fall within Ron Upper and Ron Lower) across the anticipated range of the output voltage (VdQ), the reference voltage (Vref) is varied (e.g., lowered) to force the calibration circuit 100 to select a configuration that is expected to meet the impedance specifications across the anticipated range of the output voltage (VdQ).

Figure 7:
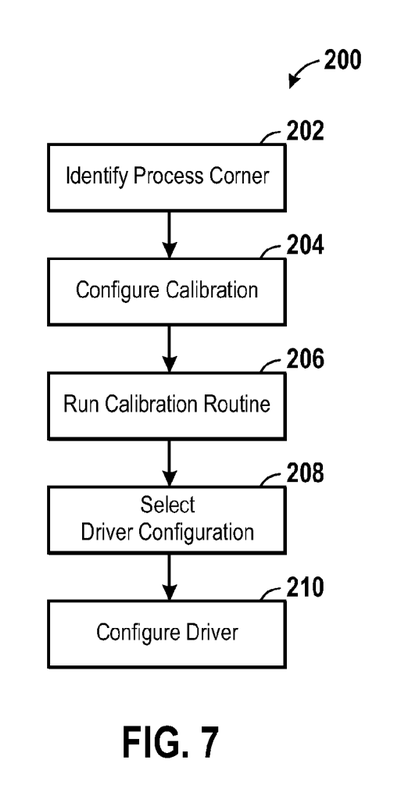
FIG. 7 is a flowchart that illustrates a method in accordance with one or more embodiments of the present invention.

FIG. 7 is a flowchart that depicts a method 200 in accordance with the previously discussed techniques. The method 200 allows various devices to meet the impedance (Ron) specification (e.g., maintain linearity) without making any changes to the driver 60 that may otherwise increase the DQ pin-cap. In general, the method 200 includes identifying a process corner of the driver 60, configuring the calibration circuit 100, running the calibration routine, selecting a configuration, and configuring the driver 60 based on the selected configuration.

More specifically, the method 200 includes identifying (e.g., detecting) a process corner of the device, as depicted at block 202. In one embodiment, detecting the process corner includes identifying which of several pre-defined categories devices of the driver 60 fall into. For example, in one embodiment, detecting includes determining whether the transistors are characterized as slow (SS), typical (TT), or fast (FF), and/or whether the passive resistive device is characterized as low or high resistance, and/or low or high capacitance. It will be appreciated that various techniques for determining the process corner exists. For example, one technique includes physically measuring the drive characteristics of transistors on silicon to determine the process corner. Other methods include dynamically detecting process corners, such as by calibrating the driver's PMOS and NMOS transistors alone and against previously calibrated pull-up 72 and pull-down legs 74.

After identifying the process corner (block 202), the method 200 includes configuring a calibration circuit, as depicted at block 204. In one embodiment, this includes configuring the calibration circuit 100 to select a desired configuration based on the process corner identified at block 202. Configuring may include leaving the calibration circuit 100 in a state and/or adjusting (e.g., setting) the calibration circuit to a state. For example, in an embodiment where the process corner does not appear to render a default calibration routine unsuitable, the calibration circuit 100 is configured in a default state. In one embodiment, the default state includes inputting a reference voltage that is approximately one-half of the supply voltage (VddQ), thereby enabling the calibration circuit 100 to cycle through the various configurations of the driver 60 and select a configuration that corresponds to a resistance that is approximately the same at the calibration resistor 102.

In another embodiment, for example, where a process corner is detected (block 202) that indicates the driver 60 may not exhibit a desirable linearity (e.g., a linearity that enables the driver to meet the impedance (Ron) specification across a range of the output voltage (VdQ)), configuring the calibration circuit (block 204) may include inputting a signal, such as a reference voltage (Vref) that forces the calibration circuit 100 to select a configuration that is expected to meet the impedance (Ron) specification across the anticipated range of the output voltage values (VdQ). For example, lowering the reference voltage (Vref) value will cause the calibration circuit 100 to select a configuration that corresponds to a configuration of the driver 60 having a lower driver resistance.

With the calibration circuit configured (block 204), the calibration routine is run, as depicted at block 206. In one embodiment, running the calibration routine includes cycling the driver 60 though each possible configuration. For example, as discussed in greater detail above, the calibration circuit 100 cycles the driver 60 through a plurality of configurations via the control signals (CTRL), while comparing the output voltage (VdQ) at the ZQ node to the reference voltage (Vref). Based on the information acquired by running the calibration routine (block 206), a configuration is selected, as depicted at block 208. In one embodiment, this includes selecting a configuration in which the driver 60 appears to have a similar resistance to the calibration resistor 102. It is noted that although the calibration routine may select a configuration that appears to have the same resistance as the calibration resistor 102, this may or may not be the case depending on how the calibration circuit was configured (block 204). For example, where the reference voltage (Vref) was set to one-half of the supply voltage (VddQ/2), the calibration circuit 100 should select the configuration that renders a driver resistance 60 that is approximately equal to the resistance of the external resistor 102. However, where the reference voltage (Vref) is varied from the one-half of the supply voltage (VddQ/2), in other words, where the reference voltage is higher or lower than VddQ/2, the calibration circuit 100 may select a configuration of the driver 60 that does not have the same resistance as the calibration resistor 102. For example, where the reference voltage (Vref) is reduced, the calibration circuit 100 will select a solution in which the driver 60 has a resistance that is lower than the resistance of the calibration resistor 102.

As depicted at block 210, the method 200 also includes configuring the driver. In one embodiment, this includes configuring the driver 60 based on the configuration selected at block 208. Configuring may include leaving the driver 60 in a configuration and/or adjusting (e.g., setting) the driver 60 to another configuration. As discussed in greater detail above, configuring the driver 60 may include using the control signal (CTRL) to configure the pull-up side and/or the pull-down side of the driver 60 to the desired resistance.

Further, it is noted that the method 200 represents merely one embodiment in accordance with the present technique. Other embodiments may be employed to vary the configuration of the driver 60 to provide the desired linearity while not increasing the DQ pin-cap. For example, although the current embodiment includes varying the reference voltage (Vref) to force the calibration circuit 100 to select a configuration that is in accordance within a desired linearity, other embodiments include directly controlling the calibration circuit 100 and/or the driver 60 to configure the driver 60. For example, other control signal(s) may be sent directly to the driver 60 and/or the calibration circuit 100 to employ one or more alternate driver configurations.

Figure 8:
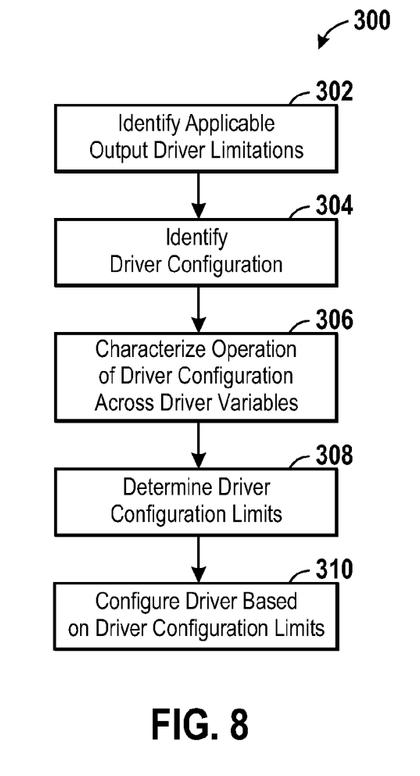
FIG. 8 is a flowchart that illustrates another method in accordance with one or more embodiments of the present invention.

FIG. 8 illustrates embodiments of another method 300 of configuring and operating a driver system 98 that addresses similar concerns. The method 300 generally includes identifying the operational limits of the driver 60 (e.g., maximum and minimum operating temperatures), identifying possible configuration (e.g., design) variations of the driver 60, characterizing the operation of the driver 60 at each of those design variations and limits, determining the operational limits of the driver 60, and implementing a configuration of the driver 60 that is capable of operating within the operational limits.

More specifically, the method 300 includes identifying applicable driver limitations, as depicted at block 302. In one embodiment, this may include a designer, an automated circuit, computer program or the like retrieving and/or reviewing constraints (e.g., specifications) that are imposed on the driver, such as the DQ pin-cap, the output impedance, the output resistance, and the like. For example, in one embodiment, identifying the applicable driver limitations includes reviewing the acceptable slope (e.g., linearity) of impedance (Ron) versus the output voltage (VdQ), per the JEDEC specification.

The method 300 also includes identifying a driver configuration, as depicted at block 304. In one embodiment, this may include identifying from variations in the hardware (e.g., ICs) that can be expected due to variations in the hardware itself, the environment, and the like, a driver configuration that meets the driver limitations at the worst case. For example, in one embodiment, identifying possible driver configuration variations (block 304) includes using simulations to identify MOS (active) to resistor (passive) resistance ratio to meet impedance (Ron) slope (linearity) specification at the worst case PVT corner (SS_LH). This may be useful as the higher passive to active resistance ratio yields a lower slope (linearity). After identifying the possible driver configuration (block 304), the method 300 includes characterizing operation of the driver across driver variables, as depicted at block 306. For example, in one embodiment, the method 300 includes characterizing the impedance of the MOS and resistor across all process, voltage, and temperature variables (e.g., ranges) that the driver is expected to encounter during operation.

The method 300 includes determining the driver configuration limits, as depicted at block 308. In one embodiment, this may include simulating operation of the driver configuration to determine how various components of the driver 60 interact at the various process, voltage, and temperature variables. For example, in one embodiment, determining the driver configuration limits (block 308) includes identifying the PVT boundaries that produce the highest and lowest impedance values, as these define the maximum and minimum number of MOS (active) and resistor (passive) units employed (e.g.,) to meet the impedance (Ron) specification (e.g., the Ron specification provided by JEDEC) across the various processes, voltages, and temperatures, respectively. Accordingly, determining the driver configuration limits may include determining configurations of the driver (e.g., the maximum and minimum number of MOS and resistor units) that are used to meet (e.g., fall within) the specification limits.

The method 300 also includes configuring a driver based on the driver configuration limits, as depicted at block 310. In one embodiment, this includes considering the applicable driver limitations (e.g., JEDEC specification limits) (block 302) to the simulated and/or observed operational configuration limits (block 308), and implementing the configuration that falls within the applicable driver limitations. For example, in one embodiment, this includes selecting a driver configuration that ensures that the driver 60 exhibits linearity within specification across all of the process, voltage, and temperature corners. More specifically, in one embodiment, this includes defining the minimum number of units (e.g., pull-up legs 72 and/or pull-down legs 74) that provide the lowest impedance PVT corner and using this configuration as the base configuration. For example, the minimum number of units, referred to collectively as the main leg, may be configured to be enabled in the resulting configuration, with the remaining legs (e.g., pull-up legs 72 and/or pull-down legs 74) enabled or disabled to meet the other impedance requirements. In one embodiment, the main leg is enabled, and the remaining legs are configured by a calibration circuit 100 to meet the highest impedance PVT corner. Accordingly, in certain embodiment, the method 300 provides a configuration of the driver 60 that is capable of providing an acceptable DQ pin-cap while meeting the linearity specification across all of the expected PVT corners. Such a technique may be employed by varying the reference voltage (Vref) in a manner similar to the techniques discussed above, or may be implemented independent of the calibration circuit 100 (i.e., in the case of the later technique, once a configuration is identified, the driver 60 is configured independent of the calibration circuit 100).

The previously discussed embodiments may prove effective in reducing and/or maintaining DQ pin-cap while meeting the linearity specification. For example, in one embodiment where the driver 60 is configured to meet the linearity specification across all PVT corners without dynamically adjusting (e.g., trimming) the reference voltage (Vref), the driver 60 had a DQ pin cap of 735 fico Farads (fF). However, lowering the linearity at the slow transistor corner via dynamically trimming the DQ node voltage, the driver 60 exhibited a DQ pin-cap of approximately 413 fF, an approximately 43.81% reduction in the DQ pin-cap, and did not compromise the linearity (Ron) specification.

It is also noted that the previously discussed techniques may be employed using hardware currently existing in memory devices, such as DDR3 memory. For example, in one embodiment, the current technique employs calibration circuitry available of DDR3 memory that allows the adjustment of the ZQ calibration reference voltage (Vref) based on a die-by-die basis. Further, it is believed that the current technique will result in smaller layout area for the driver 60 that would also lead to reduced VccQ/VssQ rail nose and result in better SSO characteristics.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method, comprising:
identifying a process corner of a driver; and
configuring the driver based on the identified process corner, wherein configuring the driver comprises configuring a calibration circuit based on the identified process corner and configuring the driver with the calibration circuit.

2. The method of claim 1, wherein configuring the driver based on the identified process corner comprises configuring the driver in a first configuration if a first process corner is identified, and configuring the driver in a second configuration if a second process corner is identified.

3. The method of claim 1, wherein configuring the driver comprises setting an output impedance/resistance based on the identified process corner.

4. The method of claim 3, wherein configuring the driver comprises configuring control signals received by the driver.

5. The method of claim 1, wherein configuring the driver comprises varying a reference voltage level to the calibration circuit.

6. The method of claim 1, wherein identifying a process corner comprises identifying a corner that indicates the driver may not exhibit a desired linearity.

7. A method, comprising:
identifying a process corner of a driver;
configuring a calibration circuit based on the process corner identified; and
configuring the driver based on the configuration of the calibration circuit.

8. The method of claim 7, wherein identifying a process corner comprises identifying a corner that indicates the driver may not exhibit a desired linearity.

9. The method of claim 7, wherein identifying a process corner comprises identifying a slow process corner.

10. The method of claim 9, wherein the process corner is a slow transistor—low resistance corner (SS_LH).

11. The method of claim 7, wherein configuring a calibration circuit comprises setting a reference voltage of the calibration circuit.

12. The method of claim 11, wherein setting the reference voltage comprises setting the reference voltage to a first voltage level if a first process corner is identified and setting the reference voltage to a second voltage level if a second process corner is identified.

13. The method of claim 7, wherein configuring the driver based on the configuration of the calibration circuit comprises configuring the driver to have one of a plurality of impedance/resistance values.

14. The method of claim 7, wherein configuring the driver based on the configuration of the calibration circuit comprises enabling and/or disabling one or more pull-up and/or pull-down legs of the driver.

* * * * *